United States Patent
Gallagher et al.

[11] Patent Number: 6,086,387
[45] Date of Patent: Jul. 11, 2000

[54] COVER ASSEMBLY FOR A SOCKET ADAPTABLE TO IC MODULES OF VARYING THICKNESS USED FOR BURN-IN TESTING

[75] Inventors: Ethan E. Gallagher, Cold Spring, N.Y.; David L. Gardell, Fairfax, Vt.; Paul M. Gaschke, Wappingers Falls, N.Y.

[73] Assignee: International Business Machines Corporation, Armonk, N.Y.

[21] Appl. No.: 09/078,769

[22] Filed: May 14, 1998

[51] Int. Cl.⁷ .................................................. H01R 9/09
[52] U.S. Cl. .............................................. 439/71; 439/331
[58] Field of Search .............................. 439/71, 73, 331, 439/525, 526, 330, 337, 66, 68–70; 361/212, 220, 820, 679, 683; 324/755

[56] References Cited

U.S. PATENT DOCUMENTS

| | | | |
|---|---|---|---|
| 4,456,318 | 6/1984 | Shibuta et al. | 339/17 CF |
| 4,717,346 | 1/1988 | Yoshizaki | 439/71 |
| 4,846,703 | 7/1989 | Matsuoka et al. | 439/71 |
| 5,100,332 | 3/1992 | Egawa | 439/72 |
| 5,312,267 | 5/1994 | Matsuoka et al. | 439/331 |
| 5,504,435 | 4/1996 | Perego | 439/71 |
| 5,586,891 | 12/1996 | Kelly et al. | 439/71 |
| 5,841,640 | 11/1998 | Shibata | 439/71 |

*Primary Examiner*—Renee Luebke
*Assistant Examiner*—J. F. Duverne
*Attorney, Agent, or Firm*—H. Daniel Schnurmann

[57] ABSTRACT

A cover assembly for a socket suitable to accommodate modules of varying thicknesses which can be advantageously used for final test and burn-in test is described. The assembly is characterized by having a low profile and includes a hinged lid; a floating shaft coupled to two cams pivoting on the floating shaft; a locking member positioned between the two cams for locking the hinged lid when in a closed position, the locking member pivoting about the floating shaft; a pressure plate for forcing the module into the socket; and stiffening members integral to the hinged lid located on opposing sides of the hinged lid and below the surface of the pressure plate for providing added strength to the assembly. The assembly also includes a heatsink inserted through an aperture located in the pressure plate, to directly contact the chip which is mounted on the module. The force applied to the chip is independent of the force applied to the module.

23 Claims, 5 Drawing Sheets

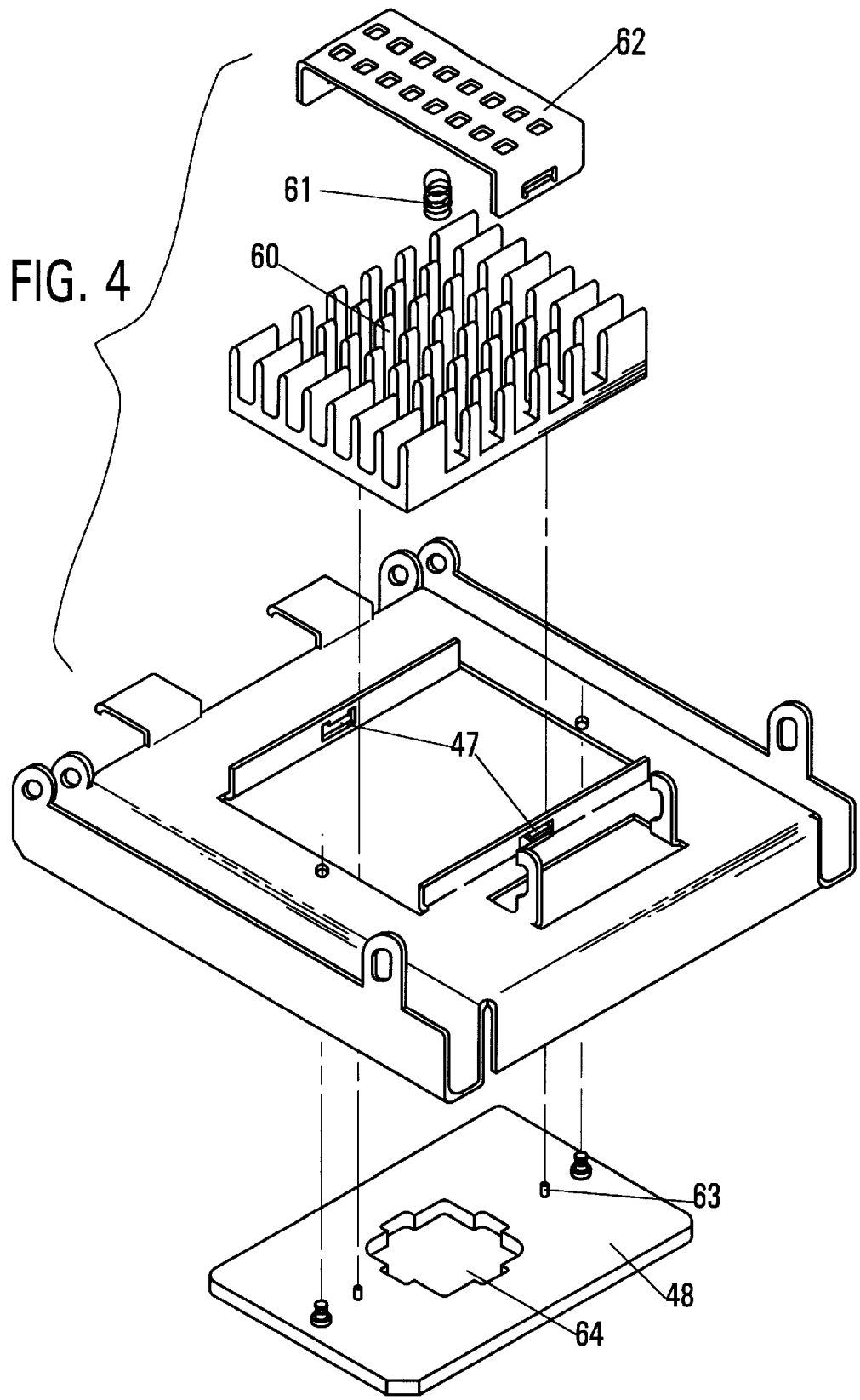

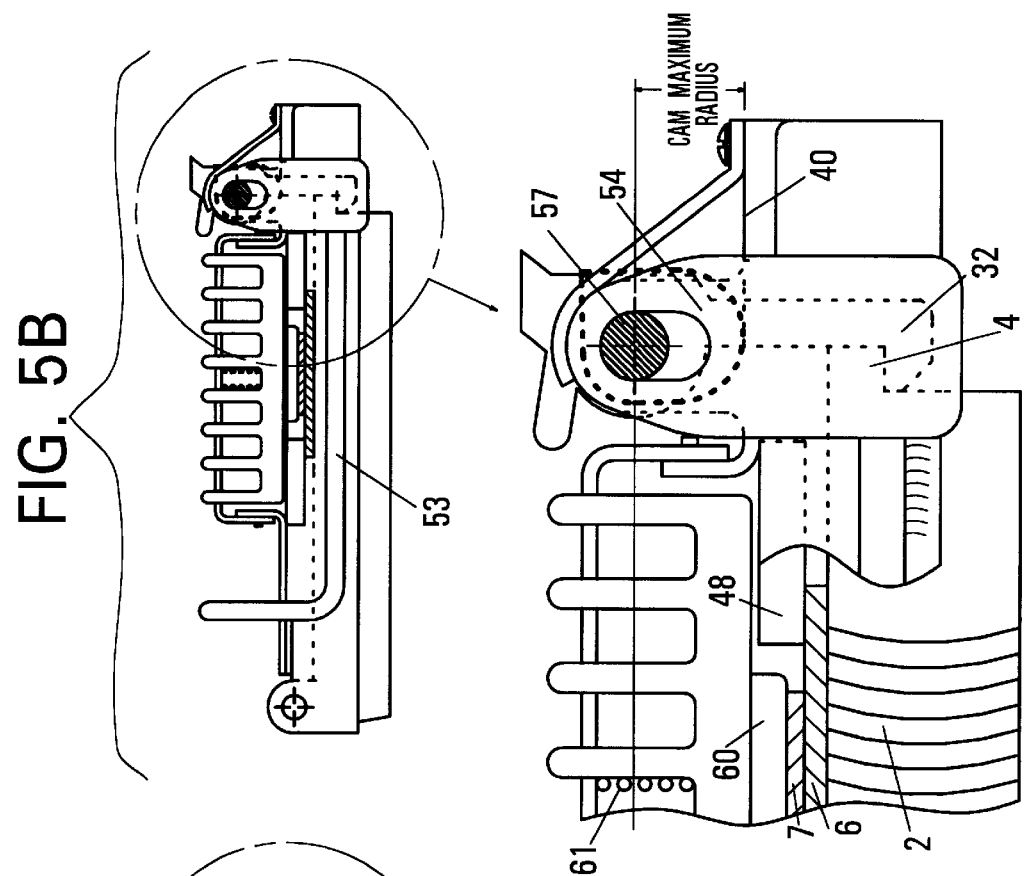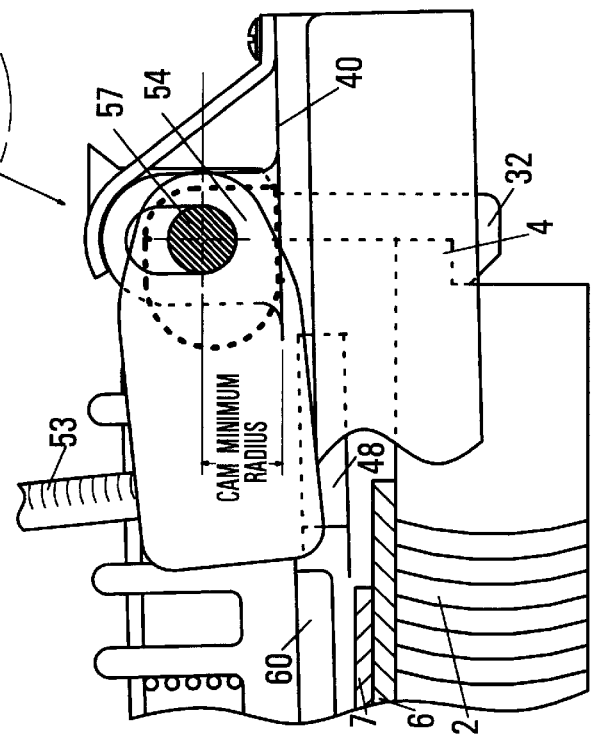

COVER ASSEMBLY FOR A SOCKET ADAPTABLE TO IC MODULES OF VARYING THICKNESS USED FOR BURN-IN TESTING

FIELD OF THE INVENTION

This invention relates to a socket used for burn-in testing and, more particularly, to a cover assembly adaptable to a socket suitable to accommodate an integrated circuit carrier module having a varying thickness, and of such a construction that it allows the module under test to be subjected to forced convective cooling.

BACKGROUND OF THE INVENTION

Test sockets adapted to carry integrated circuit (IC) chips and modules have been routinely used during final test and burn-in. These sockets are commonly used to hold in place a module carrying one or more IC chips, the combination of which is placed in an oven or a furnace during burn-in for a predetermined number of hours.

Burn-in is normally performed immediately after final testing. In as much as IC chips must function under varying environments and temperatures, burn-in is routinely appended to final testing to accelerate the occurrence of early fails (i.e., early life failures) in order to improve the overall product quality and weed out chips having reliability problems.

Sockets are designed to hold a variety of IC products, and are usually customized to the precise footprint of the chip carrier, (i.e., a single-chip module or a multi-chip module). Economic reasons encourage the reuse of a socket whenever possible even when ICs have different footprints and oftentimes different I/O contacts. Examples of the latter include pin-grid-arrays (PGA), land-grid-arrays (LGA), ball-grid-arrays (BGA), and the like.

Today's IC modules, particularly those made of ceramic, glass ceramic, or glass commonly encompass a plurality of layers, wherein each layer is used as a ground plane, a power plane, or as a personalization plane that provides interconnections between chips mounted on the module. The number of layers typically varies from 10 to 30. Practitioners of the art will fully appreciate that in order to reuse the same socket, it would be advantageous to have the socket accept IC modules of any thickness, as long as the variations are confined within certain acceptable bounds. The reusability of a socket is particularly important for CMOS products, where burn-in is of greater importance than, for instance, bipolar products, and which must be performed on a regular basis to ensure proper reliability of the product. Having to procure a personalized design that accounts for every type of module adds considerably to the cost of the product, and oftentimes makes the product uneconomical.

Another feature which must be taken in consideration while designing an IC module burn-in socket is its ability of leaving the IC chip exposed to the ambient of the chamber wherein a burn-in test takes place. Many designs are such that the IC chip or module are "buried" or sunk deep inside the base or are isolated from the environment by a cover. In such instances, the ability of the socket to dissipate heat to the ambient is limited; the high device to air thermal resistance will result in overheating of high power parts during test or burn-in.

A typical burn-in socket is described in U.S. Pat. No. 5,409,392 to Marks et al. It includes a base, a top, contacts, and movable latches. Additionally, the socket is provided with a stripper plate which serves as a table for supporting the IC to be tested. Typically, the socket is provided with a plurality of holes aligned with the engagement parts of the contacts. Whereas such a socket can be used for leaded or leadless ICs, its construction cannot be adapted to modules of varying thickness.

Another socket used for burn-in testing is described in U.S. Pat. No. 5,312,267 to Matsuoka et al., wherein a socket is provided with a pressure cover which can be opened and closed by way of a pivotal hinge. In a similar arrangement, disclosed in U.S. Pat. No. 4,456,318, to Shibata et al., an IC socket is provided with a base, a cover and a rotary lever coupled to a locking/unlocking mechanism which makes use of the sliding movement of the cover over the base on the basis of the rotation of the rotary lever. The IC is loaded after the "clam shell" style lid is opened. In both patents '267 and '318, the construction of such sockets precludes having the IC exposed to a free flow of air, by having the IC clamped deep inside the socket, which inhibits a forced convective cooling.

In yet another example of a state of the art socket, disclosed in U.S. Pat. No. 4,846,703, to Matsuoka et al., is an IC socket provided with a support that can be moved to an upper and lower position without having to apply undesired pressing forces. Sockets of this nature are designed only for lead frame IC and cannot be used, e.g., for land-grid-arrays. Moreover, in this patent, once the IC is loaded, electrical contact latches are retracted and then released over the leads of the IC. This makes an apparatus of this kind highly specialized and not readily adaptable to modules of varying thickness.

PGA, LGA, and BGA modules with high power dissipation and variations in burn-in and stress testing require that the thermal resistance between the chip or module under test and the chamber air be significantly reduced. This makes it possible to achieve shorter burn-in cycles at high temperatures and prevents thermal run-away on the more sensitive IC devices.

Thermal resistance of conventional sockets can be improved to a point by exposing the IC to free air flow. Further improvements can be obtained by having a conventional finned heatsink in direct contact with the device. Intimate contact must be maintained between the heat sink and the IC device. The height sand the planarity of the device relative to the substrate may not be consistent between one module and the next. Therefore, it is desirable that the heatsink be gimbled with respect to the socket cover.

Generally, each IC module is individually burned-in in its own socket which consists of a base containing electrical contacts and module alignment features. Sockets, typically, further include a cover that compresses the IC module or substrate onto the contacts, holding the various components together in place during testing. Such cover requires that there be sufficient mechanical advantage in the closure mechanism to allow an operator to manually close the socket. This manual action overcomes the force of the contacts that are being compressed under the IC module and facilitates the electrical contact to the test board. Furthermore, since the force that may be applied against a chip is restricted to no more than, typically, 30 psi, which is substantially less than the force required to compress the IC modules against the electrical contacts. The chip heatsink and module compression mechanism must remain independent of each other.

Prior art cover assemblies generally do not contain separate pressure plates and heatsinks. Accordingly, if an exposed IC chip is to be subjected to a burn-in test, danger exists that such an unprotected chip may be crushed by the combination pressure of the pressure plate and the heatsink. Furthermore, prior art cover assemblies are not designed to enable the heatsink and/or the chips to be exposed to forced air coming from the side of the socket assembly, an important requirement since, generally, a series of circuit boards, each containing a plurality of sockets are stacked in the burn-in chamber during testing.

OBJECTS OF THE INVENTION

Accordingly, it is an object of the present invention to provide a cover assembly for IC sockets used during final testing and burn-in test.

Another object of the invention is to provide a cover to a clamshell socket which is adaptable to hold module carrying IC chips of varying thickness.

Yet another object of the invention is to provide a compression cover to a socket adaptable to place a heatsink on a module holding a chip under test such that the force supplied to the chip by the heatsink is independent of the force applied to the substrate of the module by the cover, and further the planarity of the heatsink base is flexible with respect to the planarity of the cover.

Still another object of the invention is to provide a cover to a clamshell socket having a floating shaft and cams to enable manual closure of the aforementioned socket.

A further object of the invention is to provide a cover assembly to a clamshell socket having the lowest possible height profile to allow a series of circuit boards, each containing a plurality of sockets to be stacked in a burn-in chamber during testing.

A more particular object of the invention is to provide a cover assembly yielding a low thermal resistance by exposing more of the heatsink by moving cover strength members down to the side of the IC module.

SUMMARY OF THE INVENTION

In order to achieve the above objects, there is essentially provided a socket assembly that includes: a base for holding a module and wiring interconnections, the base having a lip protruding from a distal end of the base; and a cover assembly, the cover assembly including: a hinged lid overlapping the base having at least one stiffening member for providing added strength to the hinged lid; a floating shaft coupled to two cams pivoting on the floating shaft, positioned on one end of the hinged lid; and a locking member arranged between the two cams engaging the lip for partially closing the hinged lid onto the base, the locking member pivoting about the floating shaft.

In another aspect of the present invention, there is provided a cover assembly for a socket provided with a base for holding a module, the cover assembly including: a hinged lid overlapping the base having at least one stiffening member for providing added strength to the hinged lid; a floating shaft coupled to two cams pivoting on the floating shaft, positioned on one end of the hinged lid; and a locking member arranged between the two cams engaging the hinged lid for partially closing the hinged lid onto the base, the locking member pivoting about the floating shaft.

In yet another aspect of the invention there is provided a cover assembly for a socket suitable to accommodate a module holding at least one integrated circuit chip of varying thicknesses, the cover assembly including: a hinged lid; a floating shaft coupled to two cams pivoting on the floating shaft; a locking member positioned between the two cams for locking the hinged lid when in a closed position, the locking member pivoting about the floating shaft; stiffening members integral to the hinged lid located on opposing sides of the hinged lid for providing added strength to the hinged lid; and a heatsink pressing against a top surface of the integrated circuit module, the heatsink protruding through an aperture through the hinged lid.

BRIEF DESCRIPTION OF THE DRAWINGS

The foregoing and other objects, aspects and advantages of the invention will be better understood from the following detailed description of a preferred embodiment of the invention with reference to the drawings, in which:

FIG. 4 is a schematic diagram of an exploded view of the cover assembly with thermal components added to it;

FIG. 5a is a schematic view of the cover assembly in the partially closed position showing the cam not engaged; and FIG. 5b is a schematic view of the cover assembly in a latched position with the cam fully engaged.

DETAILED DESCRIPTION OF THE INVENTION

The preferred embodiment of the invention will be broken into three sections: the first referring to the general design of the socket including the cover assembly; the second describing the mechanical components of the cover assembly; and the third, how all the components operate jointly to achieve the objectives of the invention.

Figure 1:
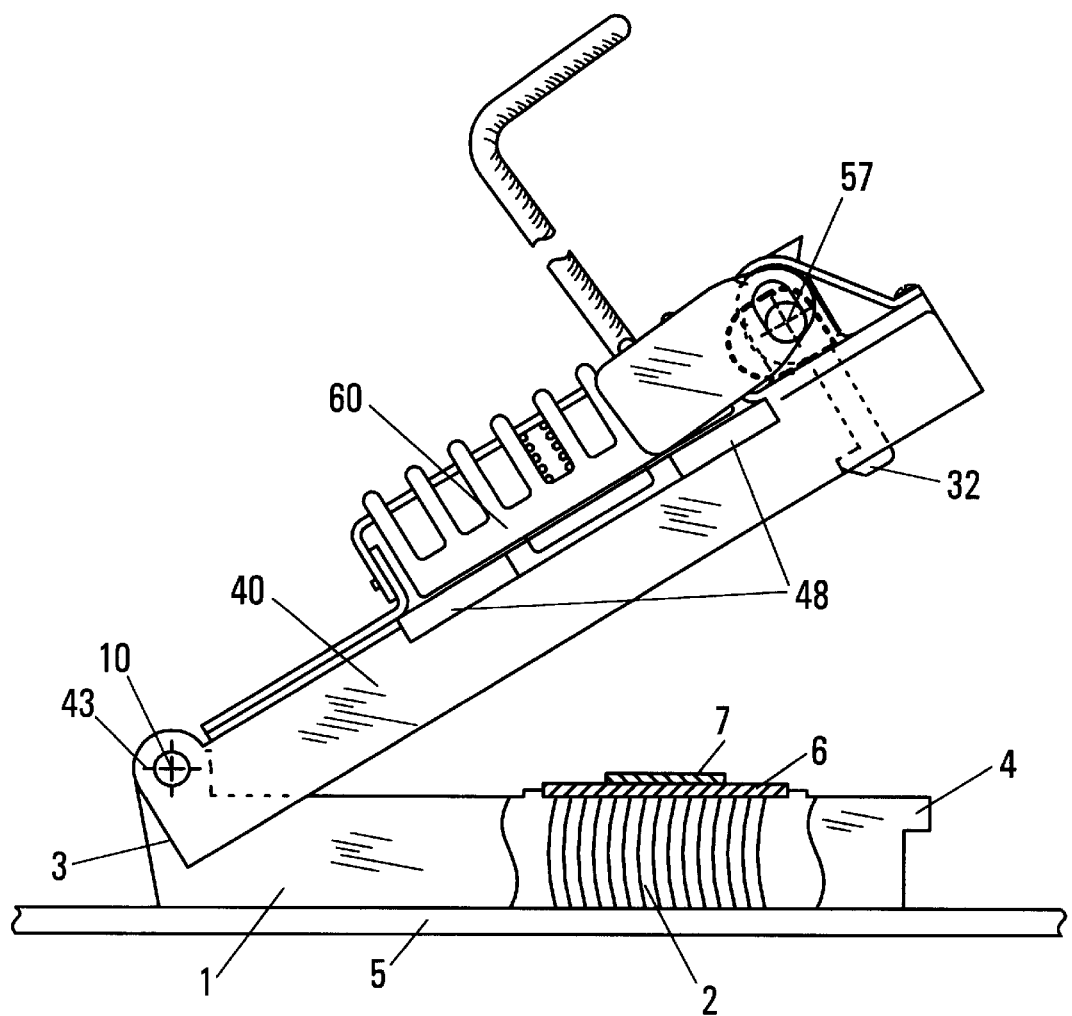
FIG. 1 is a schematic diagram of a side view of the cover assembly attached to the socket base in an open position, in accordance with the present invention.

Referring now to FIG. 1 showing a schematic diagram of the side view of the reusable socket in an open position, with an optional independent heatsink attached to it.

Numeral 40 denotes the thermal cover assembly which is attached to the socket base by way of cover hinge plates 43. The hinge plates nesting around base hinge plates 3 are coupled by hinge shaft 10. At the opposite end of the cover, pivoting on a floating shaft 57, is attached a locking member 32 which engages the locking lip 4 protruding from the base, holding the cover closed against the base. IC module 6 and attached chip 7 that are to be subjected to a burn-in test are placed and aligned on top of the base 1. The base further contains a plurality of contacts 2, such that when the socket cover is closed, a pressure plate 48 urges module 6 against the base to ensure that all the electrical contacts 2 make adequate contact. The socket base 1 is mounted on a circuit board 5 that contains electric wiring for the purpose of connecting the contacts of the base to the tester. Electrical signals are sent to and received by the tester during test.

An optional heatsink with an integral pedestal 60 is positioned directly on top of the pressure plate 48, such that when the plate comes in contact with module 6, the pedestal will contact chip 7, and the thermal resistance between the chip or module and the air flow is substantially diminished.

Figure 2:
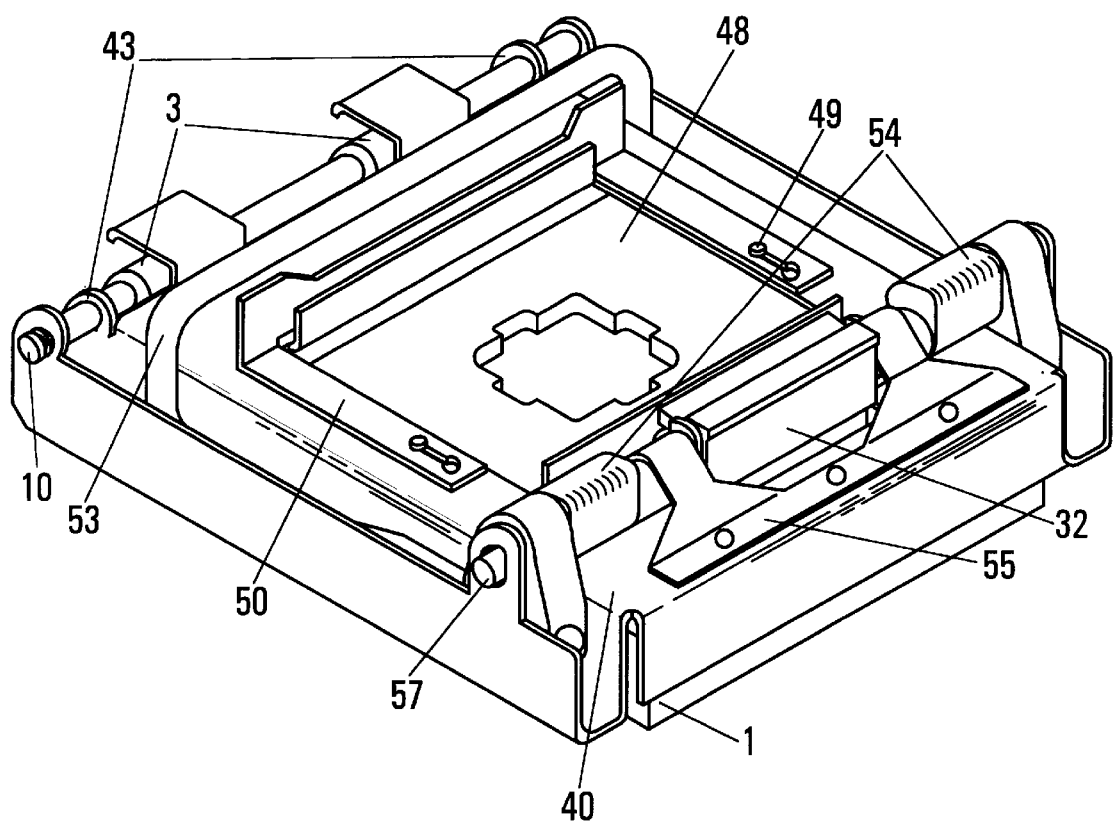
FIG. 2 is a schematic diagram showing an isometric view of the clamshell socket shown in FIG. 1, with the cover assembly in a closed position.

Referring now to FIG. 2 showing a schematic diagram of the clamshell socket with the cover assembly in a closed position.

Numeral 1 denotes a standard socket base with hinge plates 3 attached to the cover assembly 40 by way of cover hinge plates 43 and hinge shaft 10. A pressure plate 48 is attached under the lid 40 by means of retention pins 49 and locking shim 50. These components serve the purpose of adapting the cover assembly and the socket to a variety of module configurations. A pair of cams 54 are located on the front of the socket, pivoting around floating shaft 57. Cams 54 are coupled to a cam bail 53 for the purpose of manually urging the cover and module against the contacts. The cover/clamping assembly 40 attached to the base unit 1 through pivotal hinge holes 43 located at the back of the socket mates with base hinge plates 3. It is coupled with pivot shaft 10 and locking member 32, which is positioned on floating shaft 57 on the front of the socket. A bifurcated leaf spring 55 is attached to the front of cover 40 and urged against a portion of the cams in order to restrict the vertical motion of the floating shaft and cams while the socket is open.

Hereinafter are described the various compression components forming the thermal cover assembly.

Figure 3:
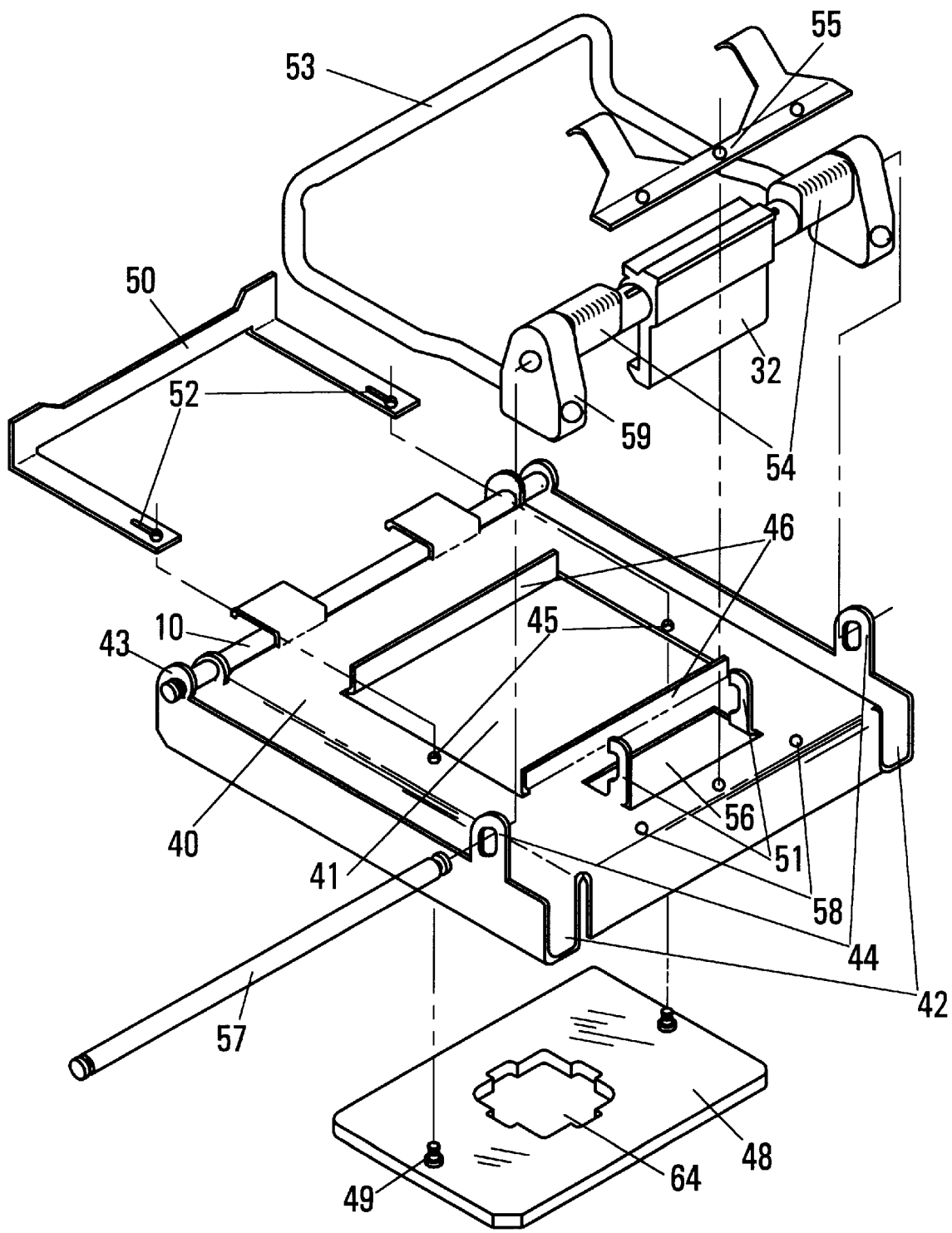
FIG. 3 is a schematic diagram of an exploded view of the compression components of the cover assembly.

Referring now to FIG. 3 showing an exploded view of the compression components of the clamshell socket cover assembly. These include cover frame 40, pivotal hinge holes 43, locking member 32, cams 54, cam bail 53, cam spring 55, pressure plate 48, pressure plate retention pins 49, pressure plate retaining clip 51 and floating shaft 57.

The cover frame 40 is preferably made of thin steel, 0.8 to 1.0 mm thick. The lid is provided with a center cutout 41, a front cutout 56, side rails 42, two outer floating shaft retention slots 44, two inner floating shaft retention slots 51, two holes 45 on the center line of the center cutout 41, and two to three holes 58 forward of front cutout 56. Lid 40 is shaped such that the side rails 42 and some excess metal 46 from the center cutout 41 provide the structural integrity required of the thin frame, enabling the module to be compressed against the contacts. A pressure plate 48 slightly larger than the center cutout 41 in the cover frame 40 is attached to the underside of the cover frame 40 by two radially slotted pins 49 located in pressure plate 48. These pins are inserted into the two holes 45 in the cover frame and retained in place by a thin steel ring or retention clip 50 which is provided with key hole slots 52. The large diameter of the keyholes is placed over the retention pin heads 49 as the pins protrude through the top of holes 45 in the cover frame. When the retention clip 50 is pushed forward, the smaller dimensioned slots in the keyhole 52 engage the slot in the pressure plate retention pins 49, thus locking the pressure plate to the underside of the cover frame.

The pressure plate 48 has a hole cut in the middle 64 to clear any chip and capacitor components when it is pressed against module 6 (see FIG. 1). The front locking member 32 is supported on a floating shaft 57 that spans from one side of the cover to the other through the vertical slots 44 integral to the cover. The locking member 32 is located in the lateral direction by the inner shaft retention slots 51 and in the front-to-back directions by the floating shaft 57. Its pivotal motion is controlled by the front and rear of the front hole 56 in the cover. A cam is attached on either end of the shaft 57. Cams 54 are located between the inner and outer vertical slot tabs 51 and 44, respectively, on each side of the shaft in such a manner as to press on the flat portion of the cover contained between the inner 51 and outer 44 vertical slot tabs. The slots in the cover are oblong in shape to make it possible for the shaft to move freely in the vertical direction but not the horizontal one. The shaft 57 is prevented from sliding out of either side by way of nuts or e-ring retainer clips. Both the locking member 32 and the cams 54 pivot around the shaft 57. The cams 54 are rotated simultaneously by attaching a bail 53 to each cam extension 55 on the outboard end of either cam. In order to keep the cams 54, locking member 32 and shaft 57 from flopping around as they are free to move vertically in the slots, a pair of leaf springs 55 are employed which attach to holes 58 in the front of the cover 40 and exert enough force on top of the cams 54 to hold the cams and, therefore, the floating shaft 57 against the bottom of the vertical slots 44 when the cams 54 are not engaged. The cams 54 are preferably eccentric cams, designed such that the minimum and maximum radius are at 90° from one another. When the bail 53 is in an upward position, the cams 54 are disengaged with the minimum radius of the cam positioned between the bottom of the floating shaft 57 and the top of the cover 40. When the bail is in a downward position, the cams are fully engaged with the maximum radius of the cams positioned between the bottom of the floating shaft 57 and the top of the cover 40.

The following section will describe the thermal components of the thermal cover assembly.

Shown in FIG. 4 is an exploded view of the thermal components of the clamshell socket cover.

The thermal components consist of a heatsink with an integral pedestal 60, center spring 61, spring clip 62, and two alignment pins 63 positioned in pressure plate 48. The two excess metal strips 46 (see FIG. 3) are additionally formed to contain each one small hook 47. The heatsink is slightly smaller than the center hole 41 in the cover, allowing it to sit on the pressure plate 48. Further, it is aligned to the pressure plate via two pins 63. The dowel pins engage alignment holes or slots in the bottom of heatsink 60. The heatsink pedestal 60 sits recessed within the center hole 64 in the pressure plate 48 to establish contact to the chip or module. The heatsink is further spring loaded against the pressure plate/cover assembly by way of a centrally located spring 61. The spring is supported on top by a steel clip 62 having a small horizontal slot on either end, and it is clipped onto the hooks 47 on the cover 40. The heatsink clip also has clearance holes in the top so as preclude inhibiting a vertical motion of the heatsink as it is urged against the chip when closing the socket.

The following section will describe the operation of the thermal cover assembly and how the various elements interrelate with each other, particularly with reference to the base, in order to accomplish the objectives of the invention.

Referring now to FIGS. 5a–5b, depicting a schematic diagram of the side view of the clamshell socket with the cover assembly in its latched position and its closed position, respectively.

FIG. 5a shows a side view of the socket with the cover pressed down such that the locking member 32 engages or latches on the locking lip 4 protruding from the base. Now, when cam bail 53 is still in the open (up) position and pressure plate 48 is just short of touching the top surface of module 6, the pedestal of heatsink 60 is almost in contact with the top of the chip 7. At this point, few of the contacts 2 touch the contact pads (or balls) on the bottom of module 6 due to contact 2 and module 6. Locking member 32, which is latched to the base locking lip 4, prevents floating shaft 57 from moving vertically. Because the cams 54 are positioned on the floating shaft 57 with the minor radius effectively positioned between the bottom of the floating shaft 57 and the top surface of the cover 40, the lid 40 is also held down by the locking member 32.

FIG. 5b shows the socket in its fully closed position with the cam bail 53 rotated downwardly and into the side rail 42 channels (see FIG. 3). As the bail 53 is rotated down, cams 54 pivot about the floating shaft 57. The rotation of the cams 54 about the floating shaft 57 results in increasing the radius of the cam 54 when it is being forced between the floating shaft and the cover 40. Because the shaft 57 is prevented from an upward movement by way of engaging the locking member 32 with locking lip 4, the increasing radius of the cam 54 pushes down the cover 40. The downward motion of the cover 40 pulls the pedestal of heatsink 60 onto the chip 7 and, simultaneously, pushes the pressure plate 48 against module 6, forcing module 6 into contact with contacts 2 (refer to FIG. 2). The heatsink spring 61 limits the force that is applied to chip 7 while the cams drive the cover 40. The pressure plate assembly 48 is pushed down with a the force required to compress module 6 onto contacts 2 to ensure a reliable electrical connections. The centrality of the spring location allows the heatsink to gimble and thus conform to the chip planarity. Practitioners in the art will fully appreciate that in its final closed position, the heatsink is 95% exposed to air flow being blown against the side of the socket. This yields the lowest thermal resistance.

The cover assembly can be further modified to accommodate a multi-chip-module (MCM) in lieu of a single-chip-module. It may even be extended to hold a thermal-conductive-module (TCM) having in excess of 100 IC chips. Since the individual chips on an MCM may have a different height and planarity, preferably, each chip should be provided with its own individual heatsink. This ensures that each chip receives the correct pressure and maximum contact area with each individual heatsink. To accomplish this, the pressure plate aperture needs to be modified to accommodate the specific number of chips, resistors and capacitors, for a given MCM. Additional alignment pins need to be added to the pressure plate to handle each chip heatsink. Additional spring retention clips may likewise be added to allow for this new configuration.

While the invention has been particularly shown and described with reference to a particular embodiment thereof, it will be understood by those skilled in the art that the foregoing and other changes in form or details may be made therein without departing from the spirit and scope of the invention.

What is claimed is:

1. A socket assembly comprising:
   a base for holding a module and wiring interconnections, said base having a top surface and a lip protruding from a distal end of said base; and
   a cover assembly, said cover assembly comprising:
   a hinged lid overlapping said base having at least one stiffening member for providing added strength to said hinged lid;
   a floating shaft coupled to two cams pivoting on said floating shaft, positioned on one end of said hinged lid; and
   a locking member arranged between said two cams engaging said lip for partially closing said hinged lid onto said base, said locking member pivoting about said floating shaft.

2. The socket assembly as recited in claim 1 wherein said wiring interconnections provide electrical contact between said module and a tester.

3. The socket assembly as recited in claim 1 wherein said module holds a chip mounted on the top surface.

4. The socket assembly as recited in claim 1 wherein said module is a multi-chip-module holding a plurality of chips.

5. A cover assembly for a socket provided with a base for holding a module, said cover assembly comprising:
   a hinged lid overlapping said base having at least one stiffening member for providing added strength to said hinged lid;
   a floating shaft coupled to two cams pivoting on said floating shaft, positioned on one end of said hinged lid; and
   a locking member arranged between said two cams engaging said hinged lid for partially closing said hinged lid onto said base, said locking member pivoting about said floating shaft.

6. The cover assembly as recited in claim 5 wherein said stiffening member is placed on opposing sides of said hinged lid and is further positioned at or below the top surface of said base.

7. The cover assembly as recited in claim 5 further comprising a cam bail coupling said two cams, for manually closing said hinged lid.

8. The cover assembly as recited in claim 7 wherein said cam bail is adapted to fit within "U" shaped channels positioned on opposing sides of said stiffening member.

9. The cover assembly as recited in claim 5 wherein said stiffening member is shaped as a channel.

10. The cover assembly as recited in claim 5 wherein said floating shaft is retained by vertical slots integral to said hinged lid.

11. The cover assembly as recited in claim 10 further comprising a dual-leaf spring pressing against said two cams and urging said floating shaft against the bottom of said vertical slots when said two cams are disengaged.

12. The cover assembly as recited in claim 5, further comprising a pressure plate inserted under said hinged lid, said pressure plate being adapted to force modules of varying configurations into said base.

13. The cover assembly as recited in claim 12 wherein said pressure plate is affixed to said base by retention pins.

14. The cover assembly as recited in claim 12 wherein said hinged lid further comprises a heatsink pressing against a chip mounted on each of said modules.

15. The cover assembly as recited in claim 14 wherein said heat-sink is affixed to said hinged lid through an aperture perforated through said hinged lid.

16. The cover assembly as recited in claim 14 wherein said heatsink further comprises:
   a chip pedestal;
   a spring pressing against the top surface of said heatsink; and
   integral to said pressure plate, a plurality of fastening and alignment means for positioning said heatsink directly against the top surface of said module.

17. The cover assembly as recited in claim 16 wherein said fastening and alignment means are selected from the group consisting of clips, hooks and pins.

18. The cover assembly as recited in claim 16 wherein said spring is positioned directly over a chip mounted on top of said chip pedestal, allowing said heatsink to gimble about said chip.

19. An assembly adaptable to a socket provided with a base holding a module, said module holding an integrated circuit chip thereon, said assembly comprising:
   a lid hinging about of said base;
   coupled to said lid, a pressure plate pressing against said module, said pressure plate having an aperture; and
   a heatsink movably attached to said lid, a portion of said heatsink extending through said aperture and contacting said chip.

20. The assembly as recited in claim 19 wherein a spring urges said heatsink into contact with said integrated circuit chip.

21. The assembly as recited in claim 19 wherein said socket accommodates a multi-chip-module holding a plurality of integrated circuit chips.

22. The assembly as recited in claim 21 wherein each of said chips is provided with its individual heatsink, each of said individual heatsinks being placed directly on top of each one of said plurality of integrated circuit chips.

23. The assembly as recited in claim 22 wherein each of said individual heatsinks is attached to an individual spring for adapting said individual heatsink to the height of said integrated circuit chip.

* * * * *